ABSTRACT

United States Patent [19]

Engle

[11] 4,399,014
[45] Aug. 16, 1983

[54] PLASMA REACTOR AND METHOD THEREFOR

[76] Inventor: Frank W. Engle, 525 Mission Dr., Pleasanton, Calif. 94566

[21] Appl. No.: 291,917

[22] Filed: Aug. 11, 1981

Related U.S. Application Data

[63] Continuation-in-part of Ser. No. 152,688, May 3, 1980, Pat. No. 4,289,598.

[51] Int. Cl.³ .............................................. C23C 15/00
[52] U.S. Cl. .............................. 204/192 E; 156/643; 204/298
[58] Field of Search .......................... 204/192 E, 298; 156/643

[56] References Cited

U.S. PATENT DOCUMENTS

| | | | |
|---|---|---|---|
| 2,891,530 | 6/1975 | Gläser et al. | 204/298 |
| 3,414,503 | 12/1968 | Brichard | 204/298 |
| 4,178,877 | 12/1979 | Kudo | 204/298 |
| 4,222,839 | 9/1980 | Goodner et al. | 204/192 E |
| 4,230,553 | 10/1980 | Bartlett et al. | 204/192 E |
| 4,277,321 | 7/1981 | Bartlett et al. | 156/643 |
| 4,285,800 | 8/1981 | Welty | 204/192 E |
| 4,287,851 | 9/1981 | Dozier | 204/192 E |
| 4,289,598 | 9/1981 | Engle | 204/192 E |
| 4,298,153 | 9/1981 | Kudo et al. | 204/192 E |

FOREIGN PATENT DOCUMENTS 2116190  5/1973  Fed. Rep. of Germany ...... 204/298

*Primary Examiner*—Arthur P. Demers
*Attorney, Agent, or Firm*—Berman, Aisenberg & Platt

[57] ABSTRACT

A plasma reactor includes a plurality of series of parallel disposed cylindrical electrodes carried in a common vacuum vessel chamber. The series of electrodes are adapted to provide alternate polarities on each side of a plurality of workpieces, such as printed circuit boards, enclosed in the reactor for treatment. Supporting brackets are provided for positioning the workpieces, parallel to and between planes formed by series of electrodes of alternate polarities. The supporting brackets are electrically isolated from the electrodes.

20 Claims, 8 Drawing Figures

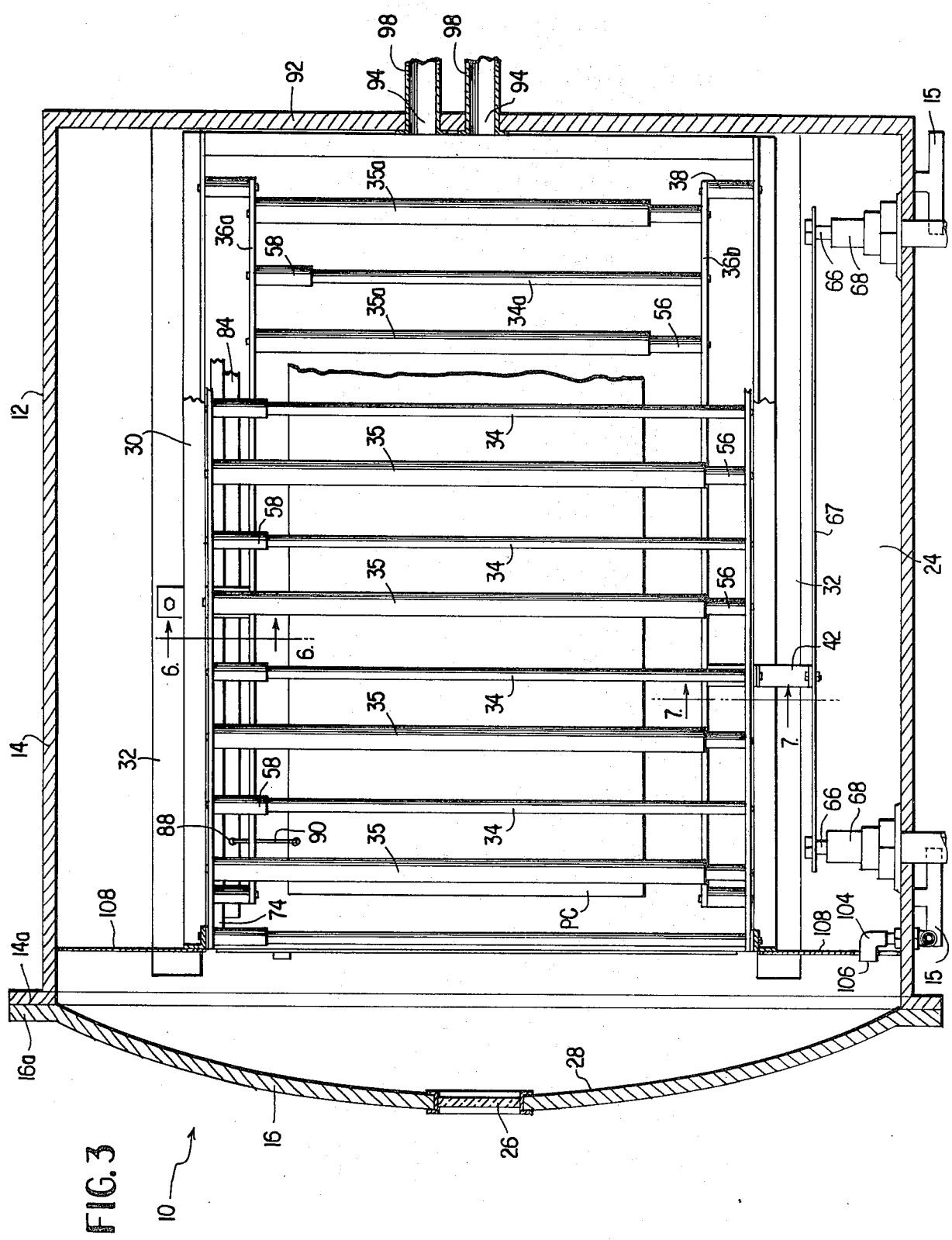

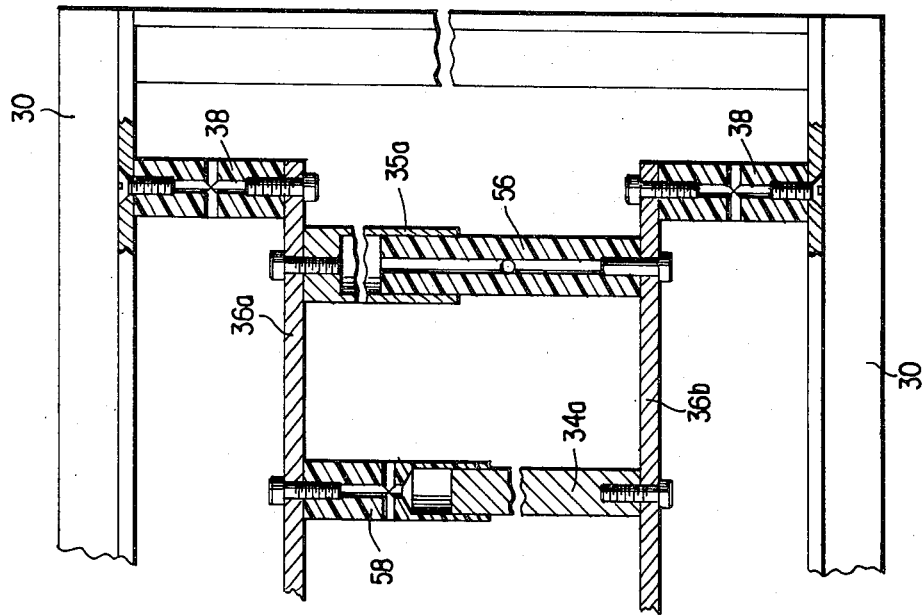
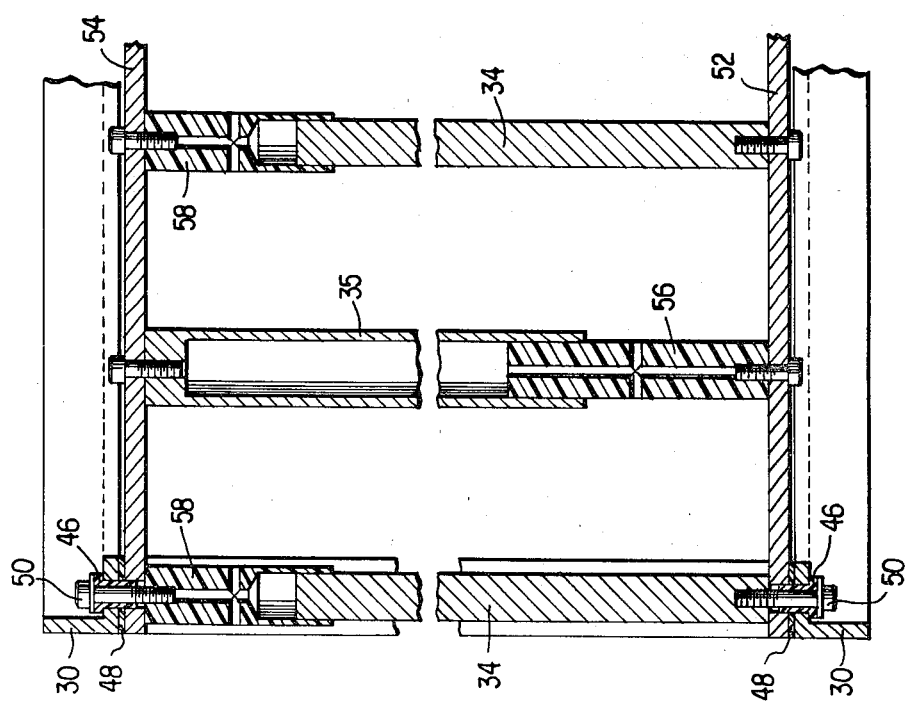

PLASMA REACTOR AND METHOD THEREFOR

BACKGROUND OF THE INVENTION

The present invention is a continuation-in-part of copending application Ser. No. 152,688, filed by the inventor on May 3, 1980, for Plasma Reactor and Method Therefor, incorporated herein by reference, now U.S. Pat. No. 4,289,598.

This invention relates to plasma reactors, and more particularly, to plasma reactors which uniformly condition workpieces treated by a gas discharge plasma within said reactor.

In the manufacture of multilayer printed circuit boards (either of the rigid or flexible variety), interconnecting holes are drilled through the boards and interconnecting metallic layers are plated within the drilled holes to provide an electrical connection between exposed edge portions of the conducting layers of the printed circuit boards. Typically, the printed circuit board's conducting layers are defined patterns of copper, separated by layers of insulating material.

A problem which has been encountered in forming interconnecting holes is commonly known in the printed circuit board art as "drill smear". The drill smear problem is the result of resin from the board, as well as bonding agents that hold the boards together, coating the inside surface of the interconnecting holes. The resulting smeared layers tend to insulate the edge portions of the conducting layers exposed within the drilled holes, and if not removed prior to plating of the apertures, individual circuits will be shielded from the plating and, therefore, not function properly.

In the past, the problem of drill smear was treated by either wet (acid) or dry (plasma) chemistry. However, each of these methods was plagued with numerous problems. A typical example of using the wet chemistry method to attack drill smear can be found in U.S. Pat. No. 4,155,775 to Alpaugh et al. Likewise, an example of utilizing dry chemistry to solve this problem can be found in U.S. Pat. No. 4,012,307 to Phillips.

In utilizing wet chemistry, corrosive chemicals are used to attack the smear and transform it into a residue that is then washed away with water, whereas in dry chemistry, a plasma is used to chemically convert the drill smear into gaseous by-products that are carried away by a mechanical vacuum pump.

In general, wet chemistry is considered the less desirable method since it creates undue hazards for personnel and excess pollutants both in the form of vapor and waste materials that are difficult to dispose of properly. Moreover, plasma desmearing is a one-step operation as compared to the wet desmearing operation which is multistep. Also, the dry chemistry method etches back the non-metallic portion of the multilayer printed circuit board adjacent to the conducting layers in the region of the drilled holes, thereby providing an increased exposed surface area of the conducting layers to which the interconnecting metallic layer is subsequently plated. Accordingly, improved mechanical adhesion of the interconnecting metallic layer results from the etching back operation.

While it is advantageous to use dry chemistry, certain difficulties and deficiencies have been encountered in prior art plasma reactors. In particular, the electrode and chamber design utilized in such plasma reactors are not compatible with large scale production systems. Furthermore, nonuniformity in workpiece conditioning has been encountered when utilizing large scale plasma reactor systems having planar electrodes. Where the circuit boards, which form an electrically isolating surface between the alternating planar electrodes, have a planar size similar to that of the electrodes, the plasma tends to be pinched, or restricted, to the board perimeters.

Additionally, if cells are not uniformly loaded, a variation in across the run and run-to-run characteristics is observed.

Therefore, it is an object of the apparatus and method of the present invention to overcome the heretofore described deficiencies of the prior art.

A particular objective of the present invention is the provision of uniformly conditioned workpieces treated in a plasma reactor apparatus suitable for large scale production operations, independently of the number or size of the workpieces.

It is a more specific object of the invention to provide a plasma reactor apparatus for conditioning workpieces, wherein electrodes of alternating polarities are disposed alongside the workpiece, and form a plane parallel thereto, to enable a uniform generation of plasma by application of an RF field alongside, rather than through, the workpiece.

These and other features and attendant advantages of the present invention will be more fully appreciated as the same become better understood from the following detailed description thereof.

SUMMARY OF THE INVENTION

The plasma reactor of the present invention is ideally suited for conditioning workpieces, such as multilayer printed circuit boards, in a gas discharge plasma. In particular, the conditioning of the printed circuit boards may include the de-smearing and etching back of interconnecting holes formed therein.

The vacuum vessel having a chamber therein is the plasma reactor housing. Within the chamber is supported a series of parallel disposed, preferably cylindrical electrodes adapted to have alternate polarities. The electrodes are disposed alongside the workpiece.

Preferably, a plurality of such series of parallel alternating polarity electrodes is provided, along with workpiece supporting means for positioning each workpiece between adjacent series of electrodes of alternating polarities. The workpiece supporting means are disposed within the vacuum vessel chamber and are electrically isolated from the electrodes.

Means are further provided for directing a uniform flow of gas across the workpiece while the workpiece is conditioned in the gas discharge plasma. In particular, the uniform gas directing means include a vacuum vessel door defining a parabolic surface within the vacuum vessel chamber, vertically disposed baffle plates, and at least three radial gas inlets disposed equidistantly about the chamber. The radial gas inlets each have a discharge end which is directed at the parabolic surface of the vacuum vessel door and located between the baffle plates and the parabolic surface.

Each series of parallel, alternating polarity cylindrical electrodes, arranged in a plane, is disposed adjacent to each workpiece, which is typically itself planar. This arrangement forms a plasma uniformly throughout the reactor independently of the size or number of workpieces. The two sets of alternating electrodes are provided with different diameters, thereby insuring that the workpieces cannot inadvertently simultaneously contact and short circuit electrodes of the oppositely poled sets.

In the method of the present invention utilizing the above-described plasma reactor, each workpiece is positioned parallel to and between two adjacent series of electrodes. The adjacent electrodes of each of the series are caused to have alternate polarities, and a gas discharge plasma is generated between alternate electrodes for conditioning of the workpiece.

BRIEF DESCRIPTION OF THE DRAWING

FIG. 3 is a partially cross-sectional view along lines 3—3 of FIG. 2.

FIG. 4 is a sectional, detailed view of a series of alternating electrodes used in the present invention, as shown along lines 4—4 of FIG. 2.

FIG. 5 is a sectional, detailed view of an end series of electrodes used in the present invention, as shown along lines 5—5 of FIG. 2.

DETAILED DESCRIPTION OF THE INVENTION

Figure 1:
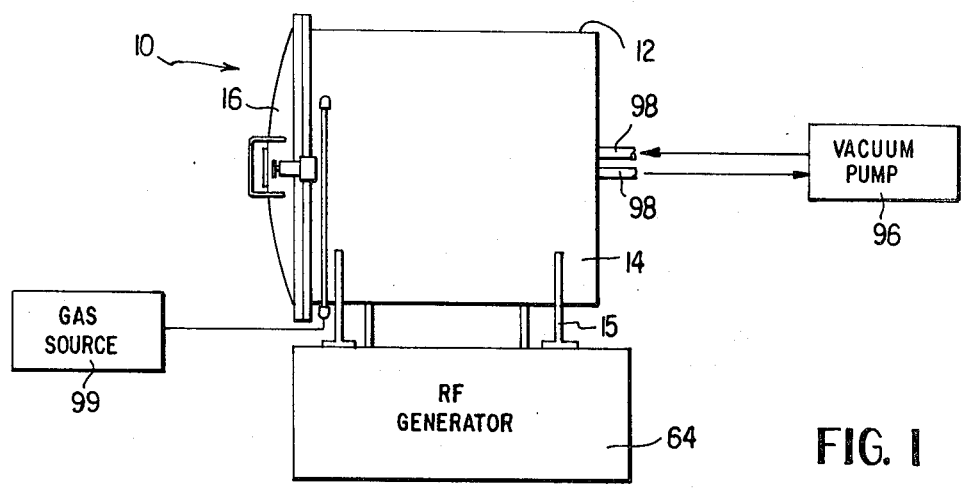
FIG. 1 is a side elevational view of the plasma reactor of the present invention.
Figure 2:
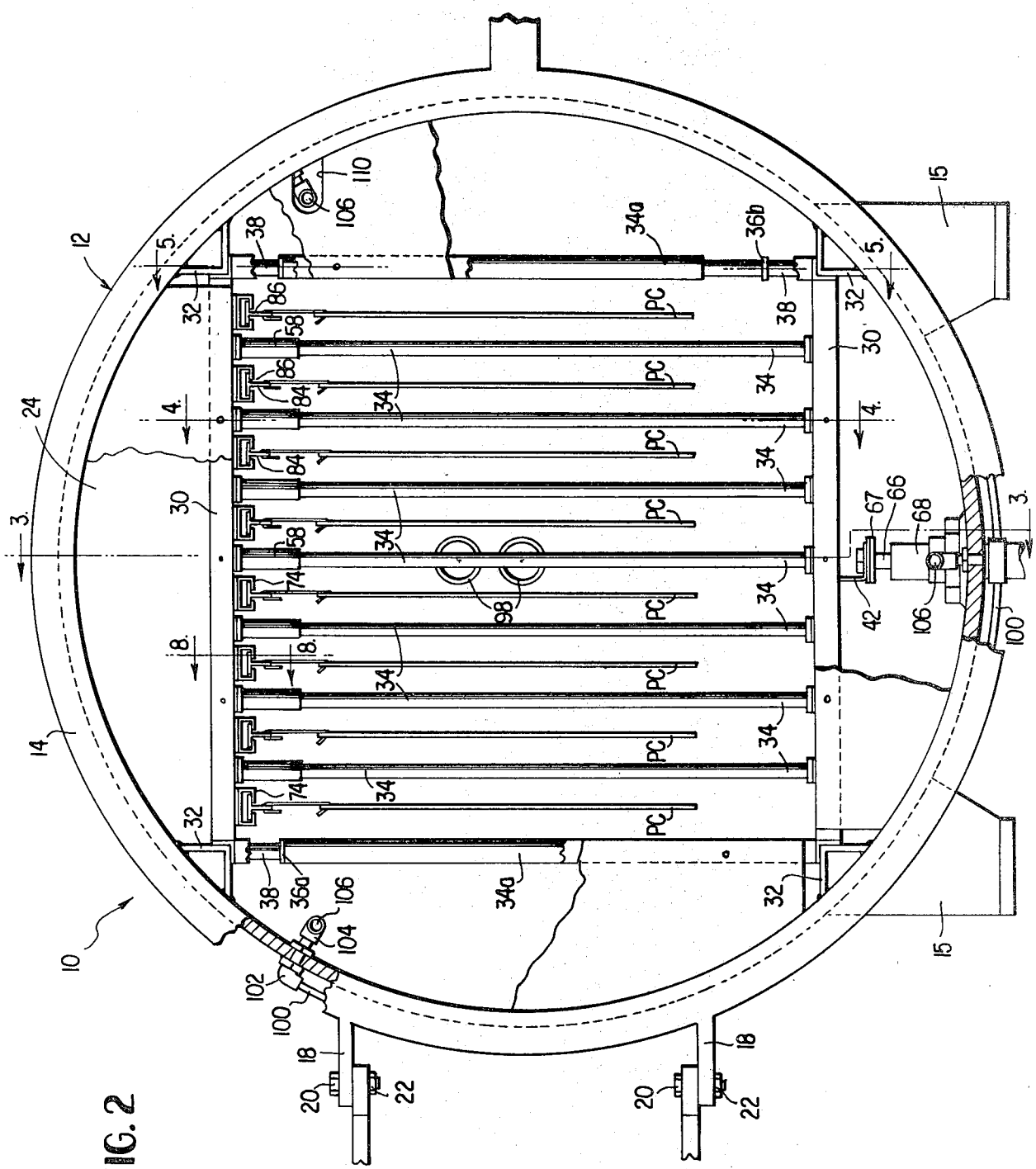
FIG. 2 is a partially cross-sectional, elevational view of the plasma reactor of FIG. 1.

Referring now to the drawings, wherein like reference numerals represent identical or corresponding parts throughout the several views, and more particularly to FIGS. 1, 2 and 3 thereof, the plasma reactor of the present invention is indicated generally by reference numeral 10. Plasma reactor 10 includes a vacuum vessel 12 having a generally cylindrically shaped section 14 with a parabolically shaped door 16 hingedly mounted thereto at brackets 18 by means of nuts and bolts 20 and 22, respectively. The vacuum vessel is supported on a work surface by legs 15 which are fixed to section 14. A chamber 24 is defined within vacuum vessel 12. Typically, vacuum vessel 12 is constructed of internally welded aluminum, and door 16 and cylindrical section 14 sealingly mate at flange members 14a and 16a, respectively, so that when required an evacuated condition is maintained within the chamber 24.

Door 16 is provided with a viewing window 26 and further defines a parabolic surface 28 within the chamber 24.

In utilizing the present invention for production type operations, the vacuum vessel 12 may be, for example, 38 inches in diameter and 48 inches deep.

A box-like cage frame 30, constructed from angle rails, is carried by vacuum vessel 12 along support members 32 which extend longitudinally through cylindrical section 14 and are welded thereto. Support members 32 are themselves formed of angle rails. Teflon pads, not shown, are positioned between support members 32 and cage frame 30 to electrically isolate cage frame 30 from vacuum vessel 12.

Secured to cage frame 30 are series of parallel, vertically disposed, alternating electrodes 34 and 35, including end electrodes 34a and 35a. Each electrode is cylindrical in structure. The electrodes are preferably approximately one inch in diameter, and spaced three inches apart, though other arrangements are possible.

A further feature of the invention is the provision of slightly different diameters of electrodes 34 and 35. Thus, if a workpiece such as a printed circuit board should swing to one side or the other during operation of the reactor, contact will be made only with the thicker diameter electrodes, e.g., electrodes 35 in FIG. 3. Direct short-circuiting of the oppositely poled electrodes by the workpiece is thus avoided.

Whereas the rear wall of the vacuum vessel 12 is shown flat, it may appear parabolic in practice for purposes of structural integrity and improved pumping speed uniformity at the rear of the electrode cage 30.

Referring now to FIGS. 2, 3, 5, 6 and 7, end electrodes 34a and 35a are supported by cage frame 30 along their periphery and are connected thereto by means of end support members 36a and 36b. Support members 36a,b are themselves secured to cage frame 30 by means of insulating connecting members 38. The end electrodes are thus electrically isolated from the cage frame 30.

The electrodes are secured to support members 36a,b by bolts 40 provided therefor. Electrodes 34 and 35 are similarly bolted to the cage frame.

Figure 6:
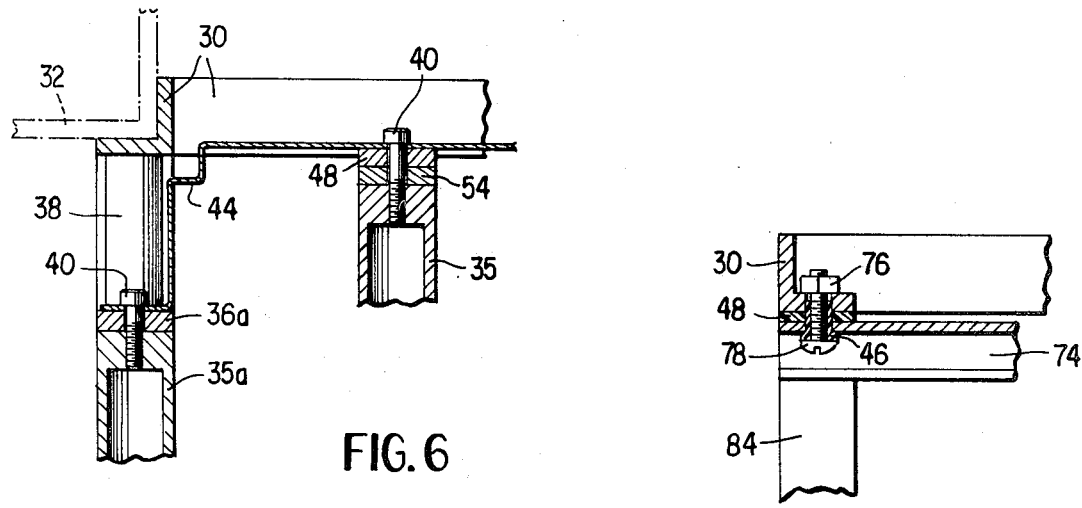
FIG. 6 is a sectional, detailed view of a top support cage structure for the electrodes of the invention, taken along lines 6—6 of FIG. 3.
Figure 7:
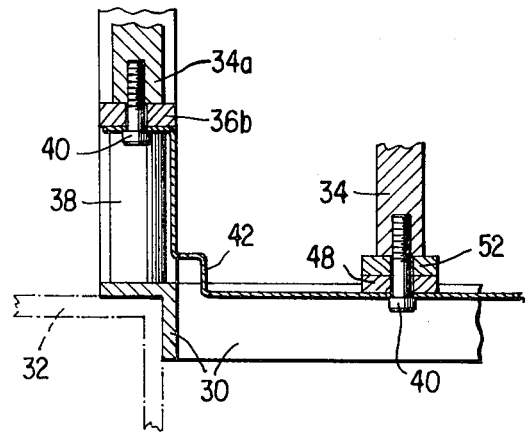
FIG. 7 is a sectional, detailed view of a bottom support cage structure for the electrodes of the invention, taken along lines 7—7 of FIG. 3.

As is apparent in FIGS. 6 and 7, separate RF and groundstraps 42 and 44 are used for providing appropriate electrical contacts to electrodes 34 and 35, respectively.

The series of end electrodes 34a and 35a are made somewhat shorter than electrodes 34 and 35 in order to maintain at least minimal physical and electrical separation between the electrodes and the chamber walls adjacent the ends of the cage structure, which are closer to the curved walls at the corner support members 32.

As previously mentioned and more clearly seen in FIG. 5, connecting members 38 for connecting support members 36a and 36b to the cage frame 30 are insulated. Thus, top support member 36a, connected to ground strap 44, acts as a common ground bus for grounding end electrodes 35a, while bottom support member 36b, connected to RF strap 42, acts as a common RF bus for RF end electrodes 34a.

Figure 8:
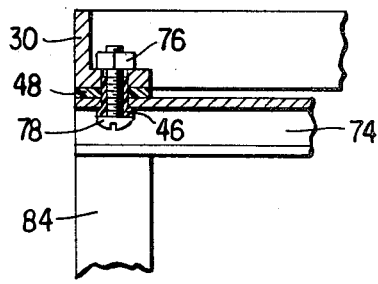
FIG. 8 is a sectional, detailed view of an upper support bracket for carrying a workpiece in the present invention, taken along lines 8—8 of FIG. 2.

It should be further noted that in order to avoid any fringing effects, and to further isolate and protect all of the electrodes, the entire cage assembly is hard anodized with an aluminum oxide, making it a dielectric to the RF plasma. The cage assembly is further stood-off by Teflon in all places where it may be associated with either ground or RF, so that it is totally isolated. Typical insulators are shown in FIGS. 4 and 8, for example, at 46 and 48, representing electrically insulating shoulder bushings and Teflon strips, respectively.

Shoulder bushings 46 are used to assure that bolts 50 in FIG. 4, used to secure electrodes 34 to cage frame 30, are insulated therefrom. Teflon strips 48 complete the insulation among bolts 50, cage frame 30, and a pair of common buses, shown at 52 and 54, providing RF and ground potential to electrodes 34 and 35, respectively.

Each electrode is mounted between the two buses, and is isolated from one or the other by bottom and top insulators 56 and 58. As seen in FIGS. 4 and 5, bottom insulators 56 have an outer diameter adapted to fit within the inner diameter of electrodes 35 or 35a, while top insulators 58 have an opening at one end with an inner diameter adapted to accommodate the outer diameter of electrodes 34 or 34a.

As is seen in the FIGS., insulators 56 and 58 are provided with through drilled and cross drilled holes, thus permitting expansion and contraction of electrodes 34 and 35 without buckling or other deleterious effects.

Electrodes 34 are bolted to contact RF bus 52 on one side, and connected via insulators 58 to ground bus 54. Electrodes 35, however, are bolted to contact ground bus 54 and connected via insulators 56 to RF bus 52. With reference to FIGS. 4, 6 and 7, RF and ground straps 42 and 44 are seen to contact each of the RF and ground buses 52-36b, and 54-36a, respectively.

In operation, electrodes 34 and 34a are maintained at a predetermined RF potential by electrical communication with an RF generator 64, as shown in FIG. 1. Two RF feed-throughs 66, shown in FIG. 3, are in electrical contact with RF generator 64, extend through the bottom of vacuum vessel 12 and are electrically isolated therefrom by insulation sleeves 68. A common conducting strap 67 extends between and is bolted to each RF feed-through. RF strap 42 is secured by bolts to common conducting strap 67 and extends therefrom to the RF buses 52, thus maintaining electrodes 34 at a predetermined RF potential. Therefore, the present invention provides parallel disposed series of adjacent electrodes of alternate polarity, i.e., ground potential and a predetermined RF potential.

While two RF feed-throughs 66 are shown in FIG. 3, it is nevertheless understood that the present invention can operate with only one RF feed-through.

Each workpiece to be conditioned in the plasma reactor 10, typically printed circuit boards designated PC in the figures, are disposed parallel to and between adjacent series of electrodes of alternate polarities. The means for so positioning the printed circuit boards include hollow-slotted bracket members 74, each of which is fixed to cage frame 30 between adjacent ground buses 54 which extend longitudinally along vacuum vessel 12. Bracket members 74 are secured to cage frame 30 by means of nuts and screws 76 and 78, respectively, as shown in FIG. 8. To assure that the printed circuit boards are not part of the electrical circuitry of the present invention, Teflon insulating strips 48 are disposed between bracket members 74 and cage frame 30. Moreover, nuts 76 and screws 78 are electrically isolated from bracket members 74 and cage frame 30 by electrical insulating shoulder bushings 46, as previously described.

T-rails 84 are supported within bracket members 74 and extend through slots 86 thereof. Apertures 88, as shown in FIG. 3, are formed in T-rails 84 to receive one hooked end of suspension members 90. The opposite hooked ends of suspension members 90 are received within openings in the printed circuit board, whereby two or more suspension members 90 support the board in a substantially parallel relationship between two adjacent series of electrodes.

It is understood that the suspension member 90 can take other conventional forms than that described above, such as alligator clips or the like.

A rear wall of vacuum vessel 12 is designated by the numeral 92 and includes two exit ports 94 in communication with a vacuum pump 96 by means of conduits 98. The atmosphere in the vacuum vessel chamber 24 is evacuated through ports 94 by activation of vacuum pump 96. While two evacuation ports 94 are described, it is nevertheless anticipated that only one exit port 94 is needed in the operation of the present invention.

The gas or gas mixture which is ignited into a gas discharge plasma in chamber 24 is provided by an external gas source 99. Gas from source 99 flows through conduit pipes 100, which are secured to vacuum vessel 12 by conventional conduit fixtures 102, and exits into chamber 24 from three radial gas inlets 104 equidistantly positioned about vacuum vessel 12. Radial gas inlets 104 are elbowed and positioned forwardly in cylindrical section 14 so that the gas exiting from their discharge ends 106 is directed towards parabolic surface 28 of closed door 16. Moreover, vertically disposed baffle plates 108 are fastened by conventional means to cage frame 30 in a forward position in cylindrical section 14 and extend from cage frame 30 to the interior surface of vacuum vessel 12. At least the discharge ends 106 of each radial gas inlet 104 extend through openings 110 in baffle plates 108 so that discharge ends 106 are positioned between baffle plates 108 and parabolic surface 28. The equidistant positioning of inlets 104, the directing of the discharge gas toward parabolic surface 28, and the baffle plates 108 provide for a uniform flow of the gas across the surfaces of the circuit boards upon the generation of a gas discharge plasma.

In a typical operation of the present invention, the printed circuit boards to be conditioned, i.e., desmeared and etched back, are disposed within chamber 24 between adjacent series of electrodes. Door 16 is secured in its closed position and chamber 24 is evacuated to a pressure of approximately 50 millitorr by means of vacuum pump 96. Vacuum pump 96 is preferably of a type which is capable of at least 120 cfm operation. Upon evacuation of chamber 34, a gas mixture, typically oxygen and freon in ratios of 7 to 3 or 8 to 2, is pumped into chamber 24 to bring the relative chamber pressure up to approximately 250 millitorr. The RF generator 64, capable of operating in a frequency range of 30 to 60 KHz with a power potential of 4800 watts, is activated to establish a predetermined RF potential at alternately positioned electrodes 34 and end electrodes 34a in FIG. 2; end electrodes 35a and electrodes 35 are, of course, maintained at ground potential. Once the electrodes in communication with RF generator 64 have reached their appropriate polarity potential, the gas mixture is ignited into a discharge plasma liberating free atomic oxygen and free fluorine for the purpose of removing drill smear and the etching back of non-metallic material of the multilayer printed circuit boards.

The parallel arrangement and close proximity of the electrodes to the printed circuit boards have resulted in a shortening of the conditioning cycle time, since the gases which are ignited in the plasma do not have to diffuse great distances in order to condition the printed circuit boards. Moreover, since each printed circuit board is positioned between two series of alternating electrodes and the plasma is struck among electrodes on the same side of the circuit board, the boards themselves, which are electrical insulators, do not impede the formation of the plasma. A uniform plasma is thus struck alongside the entire surface of the circuit board, rather than concentrating along the peripheral areas where the least isolation is found in structures utilizing planar electrodes.

Additionally, because the present arrangement provides for the plasma to be struck within the gas alongside of the board, the loading of each cell of the reactor is substantially the same, whether or not a board is included therein. Accordingly, there are no substantial capacitive or loading differences among the cells which would otherwise cause a non-uniform run-to-run characteristic in planar structures wherein the cells are not uniformly loaded.

It has also been found that the operation of the subject invention is also useful in the pretreatment of laminate panels for the purpose of improving their bondability with laminating adhesives. In pretreating applications, the apparatus and method of the present invention are similar to that discussed above, although the process time and power requirements are substantially less.

Accordingly, the present invention provides a much sought after improvement in the plasma art, whereby large scale production and uniform conditioning of workpieces, such as multilayer circuit boards, are readily obtainable.

While the invention has been described with respect to a specific embodiment, it is not limited thereto. The appended claims therefore are intended to be construed to encompass all forms and embodiments of the invention, within its true and full scope, whether or not such forms and embodiments are expressed therein.

What is claimed is:

1. A plasma reactor suitable for conditioning workpieces in a gas discharge plasma, comprising:
   a vacuum vessel having a chamber therein;
   at least one series of electrodes sin said vacuum vessel chamber, said series of electrodes being disposed along one side of a workpiece and having electrodes of alternate polarities; and
   means for supporting at least one workpiece to be conditioned in said plasma reactor alongside said series of electrodes.

2. The plasma reactor according to claim 1 wherein said electrodes are cylindrical in configuration.

3. The plasma reactor according to claim 2 wherein said electrodes of one polarity have a diameter differing from said electrodes of the other polarity.

4. The plasma reactor according to claim 1 wherein said chamber has a transversely curved surface, said workpiece and said series of electrodes being longitudinally disposed therein and parallel to each other.

5. The plasma reactor according to claim 1 wherein at least two said series of electrodes are provided, one on each side of said workpiece.

6. The plasma reactor according to claim 5 wherein one of said series is disposed closer to a transverse end of said vacuum vessel and comprises electrodes shorter than electrodes of another series disposed further from said end.

7. The plasma reactor according to claim 1 wherein said alternate polarities are ground potential and a predetermined RF potential.

8. The plasma reactor according to claim 1 further comprising cage frame means supported in said vacuum vessel and electrically insulated therefrom, said cage frame means carrying said series of electrodes and said means for supporting at least one workpiece.

9. The plasma reactor according to claim 8 wherein said cage frame means includes separate ground and RF buses for said series of electrodes, successive electrodes of said series being connected to alternate ones of said buses.

10. The plasma reactor according to claim 8 further comprising means for electrically isolating said electrodes from said cage frame means.

11. The plasma reactor according to claim 1 wherein said workpiece supporting means for supporting said workpiece comprises a slotted bracket having a support member carried therein and extending through a slot of said bracket, and means engaging and extending from said support member for holding a workpiece alongside said series of electrodes.

12. The plasma reactor according to claim 11 wherein said support member is a T-rail.

13. The plasma reactor according to claim 11 further comprising cage frame means supported in said vacuum vessel and electrically insulated therefrom, said slotted bracket fixed to said cage frame.

14. The plasma reactor according to claim 1 further comprising means for directing a uniform flow of gas across the workpiece when the workpiece is being conditioned in a gas discharge plasma.

15. The plasma reactor according to claim 14 wherein:
   (a) said vacuum vessel includes a door defining a parabolic surface in said chamber; and
   (b) said means for directing a uniform gas flow comprises:
      (i) vertically disposed baffle plates positioned within said chamber, and
      (ii) a plurality of radial gas inlets disposed equidistantly about said chamber, said radial gas inlets having discharge ends directed at the parabolic surface of said door and located between said baffle plates and said parabolic surface.

16. The plasma reactor according to claim 15 having at least three radial gas inlets.

17. The plasma reactor according to claim 15 wherein said vacuum vessel door is parabolically shaped.

18. A plasma reactor system suitable for conditioning workpieces in a gas discharge plasma, comprising:
   (a) a vacuum vessel having a chamber therein;
   (b) a plurality of series of parallel disposed electrodes supported in said vacuum vessel chamber, said series having electrodes of alternate polarities;
   (c) means for supporting workpieces to be conditioned in said plasma reactor between adjacent series of said electrodes;
   (d) a vacuum pump means in communication with said vacuum vessel chamber for evacuating said chamber;
   (e) a gas source means in communication with said vacuum vessel chamber; and
   (f) an RF generator means in electrical contact with alternately positioned electrodes in each of said series.

19. In the method of conditioning workpieces in a gas discharge plasma utilizing a plasma reactor having a vacuum vessel with a chamber therein and at least one series of electrodes supported in said chamber, the improvement comprising the steps of:
   disposing a workpiece alongside said series of electrodes and electrically isolated therefrom;
   causing said electrodes in said series to have alternate polarities; and
   generating a gas discharge plasma in said chamber.

20. The method of claim 19 further comprising the step of providing at least one other series of electrodes of alternate polarities adjacent the other side of said workpiece.

* * * * *